United States Patent
Peng et al.

(10) Patent No.: US 9,219,033 B2
(45) Date of Patent: Dec. 22, 2015

(54) VIA PRE-FILL ON BACK-END-OF-THE-LINE INTERCONNECT LAYER

(71) Applicant: Taiwan Semiconductor Manufacturing Co., Ltd., Hsin-Chu (TW)

(72) Inventors: Chao-Hsien Peng, Zhubei (TW); Chi-Liang Kuo, Hsinchu (TW); Ming-Han Lee, Taipei (TW); Hsiang-Huan Lee, Jhudong Township (TW); Shau-Lin Shue, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/221,509

(22) Filed: Mar. 21, 2014

(65) Prior Publication Data

US 2015/0270215 A1 Sep. 24, 2015

(51) Int. Cl.
*H01L 23/522* (2006.01)
*H01L 21/00* (2006.01)
*H01L 23/528* (2006.01)
*H01L 23/532* (2006.01)
*H01L 21/768* (2006.01)
*H01L 21/285* (2006.01)
*H01L 21/288* (2006.01)

(52) U.S. Cl.
CPC .......... *H01L 23/5226* (2013.01); *H01L 21/288* (2013.01); *H01L 21/28556* (2013.01); *H01L 21/7685* (2013.01); *H01L 21/76807* (2013.01); *H01L 21/76858* (2013.01); *H01L 21/76877* (2013.01); *H01L 23/528* (2013.01); *H01L 23/53209* (2013.01); *H01L 23/53223* (2013.01); *H01L 23/53252* (2013.01); *H01L 23/53261* (2013.01); *H01L 23/53266* (2013.01)

(58) Field of Classification Search
CPC ............... H01L 21/76843; H01L 21/7684; H01L 21/76849; H01L 23/5226; H01L 23/53238; H01L 23/53223; H01L 21/7685; H01L 21/28556; H01L 21/76877; H01L 21/76807; H01L 21/76858; H01L 21/288; H01L 23/53261; H01L 23/53266; H01L 23/53252; H01L 23/53209; H01L 23/528
See application file for complete search history.

(56) References Cited

U.S. PATENT DOCUMENTS

| | | | |
|---|---|---|---|
| 6,949,472 B1 * | 9/2005 | Huang et al. | 438/758 |
| 7,060,624 B2 | 6/2006 | Andricacos et al. | |
| 7,078,810 B2 * | 7/2006 | Wang et al. | 257/751 |

(Continued)

OTHER PUBLICATIONS

Iijima, et al. "Growth Behavior of Self-Formed Barrier Using Cu—Mn Alloys at 350 to 600 degrees C." IEEE International Interconnect Technology Conference, Jun. 2006.

*Primary Examiner* — Nikolay Yushin
(74) *Attorney, Agent, or Firm* — Eschweiler & Associates, LLC

(57) ABSTRACT

The present disclosure relates to a metal interconnect layer formed using a pre-fill process to reduce voids, and an associated method. In some embodiments, the metal interconnect layer has a dielectric layer disposed over a substrate. An opening with an upper portion above a horizontal plane and a lower portion below the horizontal plane extends downwardly through the dielectric layer. A first conductive layer fills the lower portion of the opening. An upper barrier layer is disposed over the first conductive layer covering bottom and sidewall surfaces of the upper portion of the opening. A second conductive layer is disposed over the upper barrier layer filling the upper portion of the opening.

20 Claims, 8 Drawing Sheets

(56) References Cited

U.S. PATENT DOCUMENTS

| | | |
|---|---|---|
| 7,585,768 B2 | 9/2009 | Bu et al. |
| 8,956,967 B2 * | 2/2015 | Ozaki et al. .................. 438/626 |
| 2006/0113673 A1 * | 6/2006 | Wang et al. .................. 257/762 |
| 2009/0072406 A1 * | 3/2009 | Yang et al. .................. 257/761 |
| 2009/0117731 A1 * | 5/2009 | Yu et al. .................. 438/627 |
| 2012/0325920 A1 * | 12/2012 | Ozaki et al. .................. 237/67 |

* cited by examiner

VIA PRE-FILL ON BACK-END-OF-THE-LINE INTERCONNECT LAYER

BACKGROUND

In the manufacture of integrated circuits (ICs), devices are formed on a wafer and connected together by multiple conductive interconnection layers. These conductive interconnection layers are formed by first forming gaps, like trenches and vias in a dielectric layer and then filling gaps with a conductive material.

The conductive material is usually formed within the gaps by an electrochemical plating process (ECP process). A barrier layer is firstly formed within the gaps in the dielectric layer. A seed layer is then formed over the barrier layer. The remaining space of the gaps is filled in succession with the conductive material. Then a planarization is performed to remove excess conductive material.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
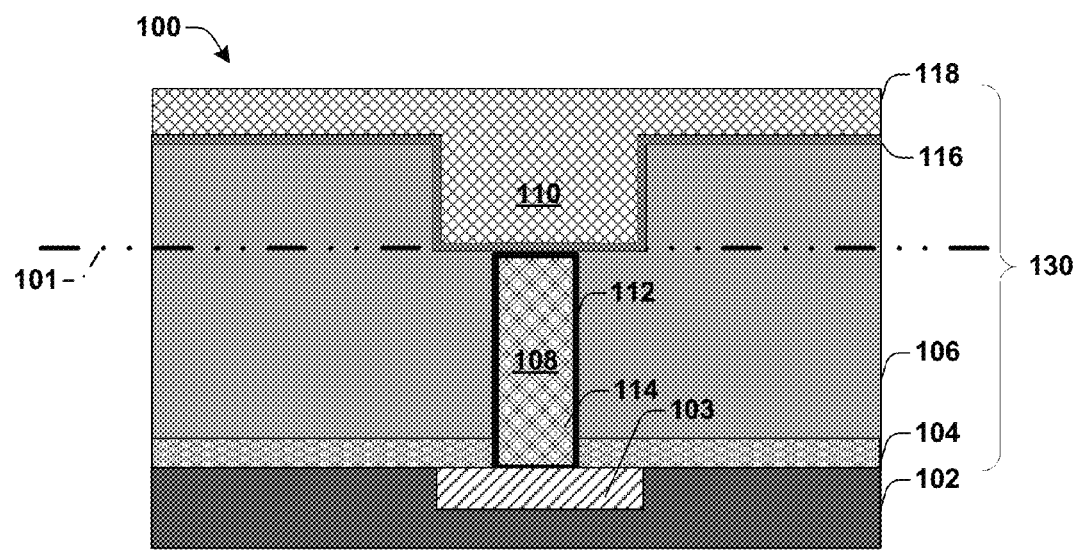
FIG. 1A shows a cross-sectional view of a substrate having one or more conductive interconnection layers in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With the continued scaling down of semiconductor devices, feature sizes of back-end-of-the-line (BEOL) metal interconnects have also decreased. The decreased feature sizes of BEOL metal interconnects have resulted in larger aspect ratios for the gaps such as trenches and vias, which are filled with conductive layers during the formation of the metal interconnects. The larger aspect ratios of vias and trenches in dual damascene metallization processes have been difficult for electrochemical plating (ECP) processes to fill, resulting in the formation of voids, or areas in which the conductive material is not formed, in the via trenches. Since voids do not have conductive material, they can result in bad connections and hurt reliability.

Accordingly, the present disclosure relates to a method of filling gaps using a via pre-fill process to reduce voids within dual damascene metal layers, and an associated apparatus. In some embodiments, the method comprises removing a selected portion of a dielectric layer to form an opening comprising an upper portion (e.g., a trench) and a lower portion (e.g., a via). A selective deposition of a pre-fill layer is performed to fill a part of the lower portion of the opening. Then a barrier layer, a seed layer and a conductive layer are formed in succession over the pre-fill layer. By selectively depositing a pre-fill layer to fill the lower portions of the opening, voids in the lower portion of the opening are filled prior to forming the conductive layer using an ECP process, thereby avoiding the formation of voids.

FIG. 1A shows a cross-sectional view 100 of a substrate having one or more conductive interconnection layers in accordance with some embodiments. A dielectric layer 106 is disposed over a semiconductor substrate 102. An opening extending downwardly through the dielectric layer 106 comprises an upper portion 110 above a horizontal plane 101 and a lower portion 108 below the horizontal plane 101. A ratio of a largest longitudinal dimension to a smallest lateral dimension of the opening may be between approximately 4:1 and approximately 10:1. The ratio is referred by aspect ratio.

The lower portion 108 of the opening is filled by a first conductive layer 114 and the upper portion 110 of the opening is filled with a second conductive layer 118.

In some embodiments, the opening can be a dual damascene structure vertically extending through dielectric layer 106. In such embodiments, the opening may comprise a trench and an underlying via vertically extending through the dielectric layer 106. The via has a lateral dimension that is smaller than that of the trench. A part of the via, for example, a half, less than a half or more than a half of the via can be filled by the first conductive layer 114. The remaining part of the via together with the trench can be filled by the second conductive layer 118.

The first and second conductive layers, 114 and 118, can be either same or different materials. For example, the first and second conductive layers, 114 and 118, can both comprise copper (Cu), or the first conductive layer 114 can comprise cobalt (Co), ruthenium (Ru), aluminum (Al), molybdenum (Mo), Tungsten (W), CoW, or cobalt tungsten phosphorous (CoWP). An upper barrier layer 116 is disposed between the first conductive layer 114 and the second conductive layer 118. The upper barrier layer 116 covers bottom and sidewall surfaces of the upper portion 110 of the opening. The upper barrier layer 116 can comprise tantalum nitride (TaN), titanium nitride (TiN), manganese nitride (MnN), silicon carbon (SiC), silicon nitride (SiN), silicon oxide carbon (SiOC), or silicon oxide nitride (SiON).

In some embodiments, a top, bottom and sidewall regions of the first conductive layer 114 can be surrounded by a metal oxide barrier layer 112. A portion of the metal oxide barrier layer 112 on the sidewall region may have a thickness having a range of from approximately 1 nm to approximately 10 nm. A thickness of another portion of the metal oxide barrier layer 112 on bottom region can be thinner than that on the sidewall region. In some embodiments, the metal oxide barrier layer 112 could be manganese oxide ($MnO_x$). In other embodiments, the metal oxide barrier layer 112 may also comprise an oxide compound having Magnesium (Mg), Aluminum (Al), Zirconium (Zr), Molybdenum (Mo), Titanium (Ti), Tantalum (Ta), or Tungsten (W). The upper barrier layer 116 and the metal oxide barrier layer 112 are formed to help the first and second conductive layers, 114 and 118, from migrating to the dielectric layer 106.

The dielectric layer 106, the metal oxide barrier layer 112, the upper barrier layer 116 and the first and second conductive layers, 114 and 118, filled therein can be a portion of a conductive interconnection layer 130. An etch stop layer 104 is formed underneath the dielectric layer 106 over the substrate 102. One or more additional conductive interconnection layers (e.g. 103) can be formed and connected either under or above the conductive interconnection layer 130. In some embodiments, the first conductive layer 114 can be electrically coupled to a lower conductive interconnection layer 103. In some other embodiments, the conductive interconnection layer 130 can be directly connected to an active region of a semiconductor device.

Figure 1B:
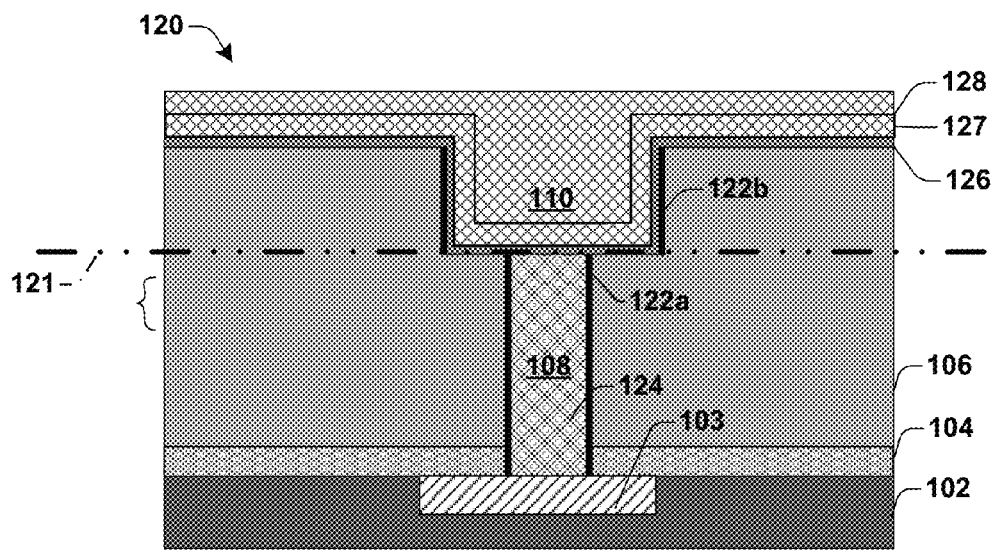
FIG. 1B shows a cross-sectional view of a substrate having one or more conductive interconnection layers in accordance with some other embodiments.

FIG. 1B shows a cross-sectional view of a substrate 120 having one or more conductive interconnection layers in accordance with some other embodiments. A dielectric layer 106 is formed over a semiconductor substrate 102 and an etch stop layer 104. An opening extending downwardly through the dielectric layer 106 and the etch stop layer 104 comprises a lower portion 108 filled by a first conductive layer 124 and an upper portion 210 filled by a second conductive layer 128. An upper barrier layer 126 is disposed along a horizontal plane 121 separating the first conductive layer 124 and the second conductive layer 128. A seed layer 127 can be formed between the upper barrier layer 126 and the second conductive layer 128. The upper barrier layer 126 covers bottom and sidewall surfaces of the upper portion 210 of the opening.

A lower barrier layer 122 comprises a first portion 122a disposed on sidewalls of the lower portion 108 of the opening and a second portion 122b disposed on sidewalls of the upper portion 210 of the opening. The second portion 122b of the lower barrier layer is sandwiched between the dielectric layer 106 and the upper barrier layer 126. In some embodiments, no barrier layer is disposed on the bottom surfaces of the lower and upper portions 108 and 126 so that the first conductive layer 124 is abutting another lower conductive interconnection layer 103 or an active region of a semiconductor device. In some embodiments, the lower portion 108 of the opening can be a part of a via and the upper portion 126 can be a trench.

Figure 2:
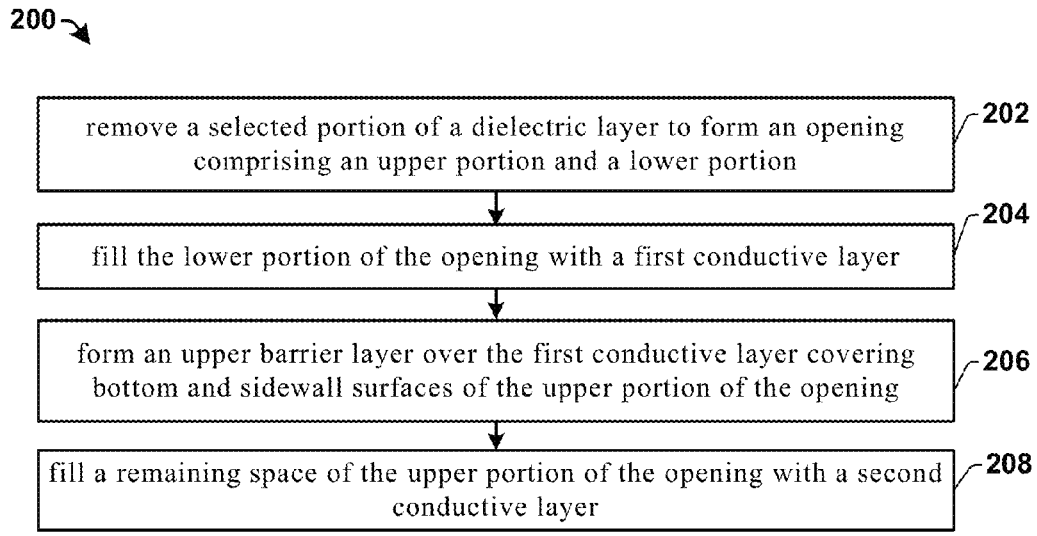
FIG. 2 shows a flow diagram of a method of filling a gap for interconnections in accordance with some embodiments.

FIG. 2 shows a flow diagram 200 of a method of filling a gap in accordance with some embodiments.

At 202, a selected portion of a dielectric layer is removed to form an opening comprising an upper portion and a lower portion.

At 204, the lower portion of the opening is filled with a first conductive layer. In some embodiments, the lower portion of the opening may be filled by a first plating process. In other embodiments, the lower portion of the opening maybe filled by a vapor deposition technique (e.g., CVD, PVD, etc.).

At 206, an upper barrier layer is formed over the first conductive layer covering bottom and sidewall surfaces of the upper portion of the opening.

At 208, a remaining space of the upper portion of the opening is filled with a second conductive layer. In some embodiments, the remaining space of the upper portion of the opening may be filled by a second plating process (e.g., an electroplating process).

By filling the lower portion of the opening with the first conductive layer prior to filing the upper portion of the opening with a second conductive layer, method 200 prevents the formation of voids within the lower portion of the opening.

Figure 3:
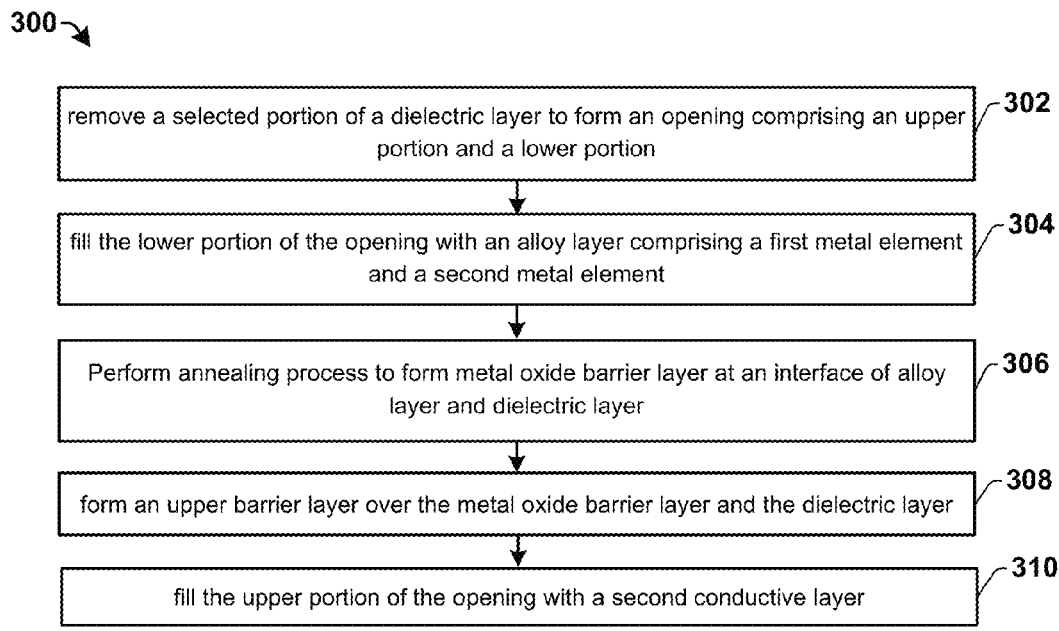
FIG. 3 shows a flow diagram of a method of filling a gap for interconnections in accordance with some additional embodiments.

FIG. 3 shows a flow diagram 300 of a method of filling a gap for interconnections in accordance with some additional embodiments.

While disclosed methods (e.g., methods 200, 300, and 500) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 302, a selected portion of a dielectric layer is removed to form an opening comprising an upper portion and a lower portion. The opening can be formed by a damascene process. In some embodiments, the opening can be formed by via first, trench first or self-aligned dual damascene process.

At 304, the lower portion of the opening is filled with an alloy layer comprising a first metal element and a second metal element.

At 306, an annealing process is performed to form a metal oxide barrier layer at an interface of the alloy layer and the dielectric layer. The metal oxide barrier comprises the second metal element that has migrated from the alloy layer.

At 308, an upper barrier layer is formed over the metal oxide barrier layer and the dielectric layer.

At 310, the upper portion of the opening is filled with a second conductive layer. The second conductive material can be formed by an electrochemical plating (ECP) process.

FIGS. 4A-4E show cross-sectional views of a semiconductor device showing a method of filling a gap in accordance with some embodiments. Although FIGS. 4A-4E are described in relation to method 400, it will be appreciated that the structures disclosed in FIGS. 4A-4E are not limited to such a method.

Figure 4A:
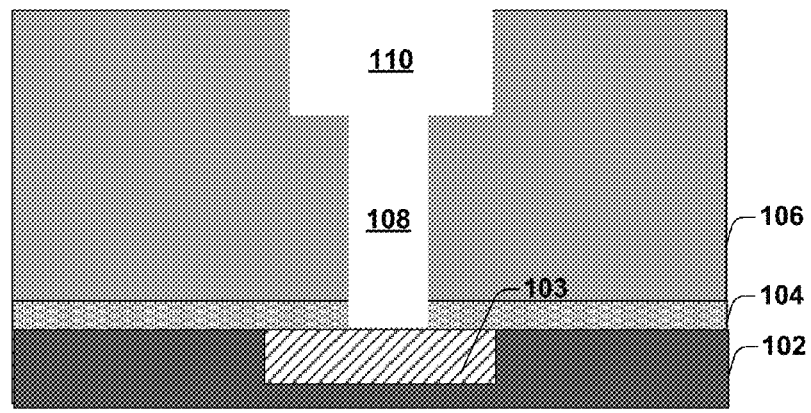
FIGS. 4A-4E show cross-sectional views of conductive interconnection layers showing a method of filling a gap for interconnections in accordance with some additional embodiments.

As shown in FIG. 4A, a selected portion of a dielectric layer 106 disposed over a substrate 102 is removed to form an opening comprising an upper portion 110 and a lower portion 108. In some embodiments, there is an etch stop layer 104 disposed underneath the dielectric layer 106. In such embodiments, a corresponding portion of the etch stop layer 104 is also removed at a same etching process such that underlying conductive interconnection layer 103 is exposed. The opening can be formed by a dual damascene process wherein a via 108 can be formed underneath a trench 110. In some embodiments, the opening can be formed by via first, trench first or self-aligned dual damascene process.

Figure 4B:
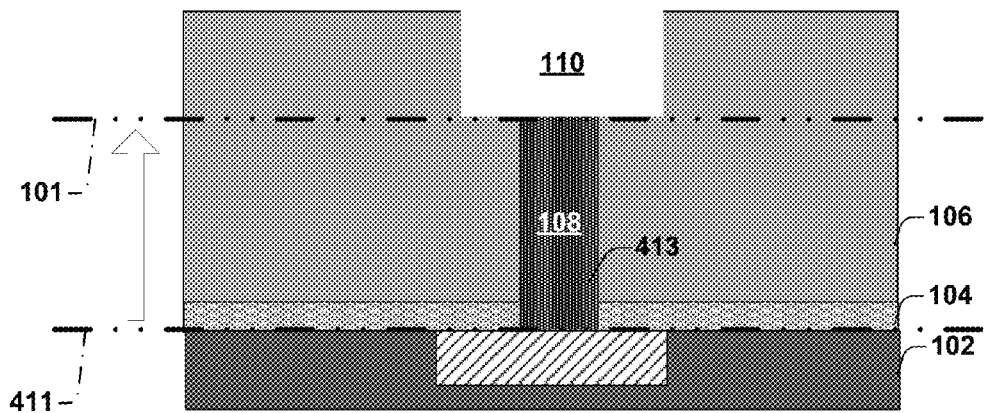

As shown in FIG. 4B, the lower portion 108 of the opening is filled with an alloy layer 413 comprising a first metal element and a second metal element. In some embodiments, the first metal element may comprise copper and the second metal element may comprise manganese. In some other embodiments, the second metal element of the alloy layer can be Manganese (Mn), Mg (Magnesium), Aluminum (Al), Zr (Zirconium), Molybdenum (Mo), Titanium (Ti), Tantalum (Ta), or Tungsten (W). The filling process can be a bottom up plating process wherein the alloy layer growth starts at a bottom of the lower portion 411 of the opening and progresses upwards to a surface of the lower portion of the opening along a plane 101. The plating process can be an electroless plating process having a bath comprising formaldehyde or glyoxyic acid as a reduction agent. The bath can further comprise a copper organic compound solvent.

Figure 4C:
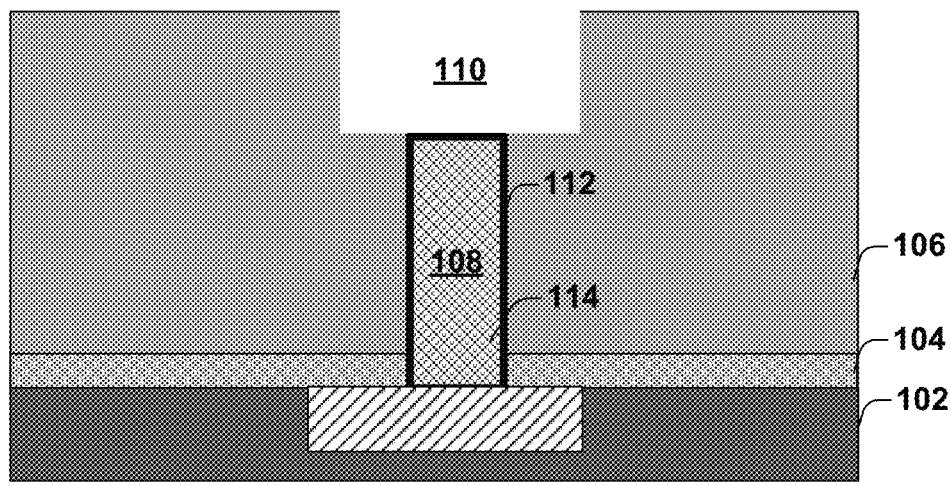

As shown in FIG. 4C, an annealing process is performed to form a metal oxide barrier layer 112 at an interface of the alloy layer 413 and the dielectric layer 106. The metal oxide barrier layer 112 comprises the second metal element that has migrated from the alloy layer. Meanwhile, a first conductive layer 114 comprising the remaining first metal element replaces the alloy layer 413. A portion of the metal oxide barrier layer 112 at the bottom of the lower portion may be thinner that the remaining portion on sidewall and top surface. The oxygen used to form the metal oxide barrier layer 112 can come from either the abutting dielectric layer 106 or from air alloy layer 413 is exposed to. The annealing process can be performed at a temperature having a range of between approximately 300° C. (Celsius degree) to approximately 450° C. for a time in a range of between approximately 10 min (minutes) and approximately 60 min within a processing chamber.

Figure 4D:
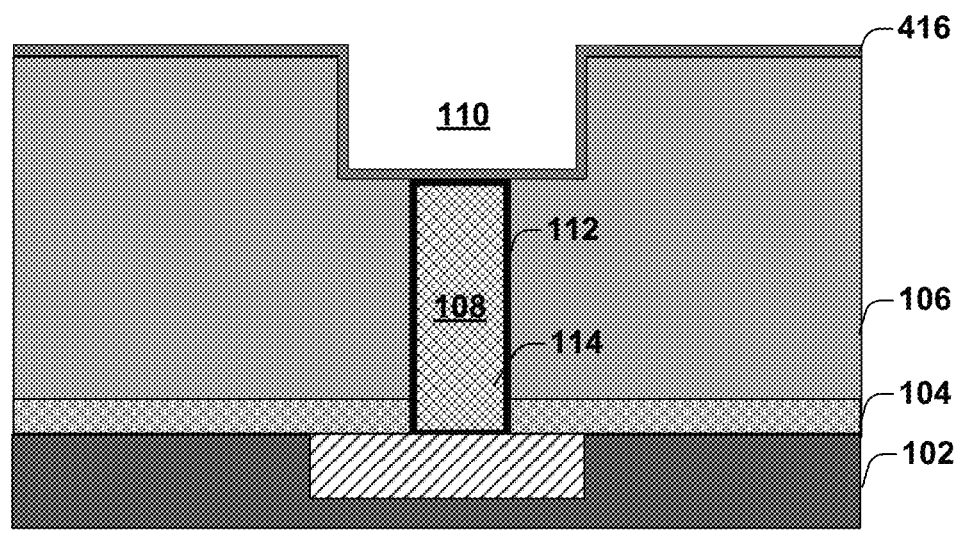

As shown in FIG. 4D, an upper barrier layer 416 is formed over the metal oxide barrier layer 112 and the dielectric layer 106. The upper barrier layer 416 is disposed onto the bottom and sidewall surfaces of the upper portion 110. In some embodiments, the upper barrier layer 416 may be formed by a vapor deposition technique (e.g., CVD, PVD, etc.). In various embodiments, the upper barrier layer 416 may comprise tantalum nitride (TaN), yitanium nitride (TiN), manganese nitride (MnN), silicon carbon (SiC), silicon nitride (SiN), silicon oxide carbon (SiOC), or silicon oxide nitride (SiON). The upper barrier layer 416 comprises a thin liner covering top, bottom and sidewall surfaces of the upper portion of the opening, which is configured to prevent migration of the conductive layer into the dielectric layer.

Figure 4E:
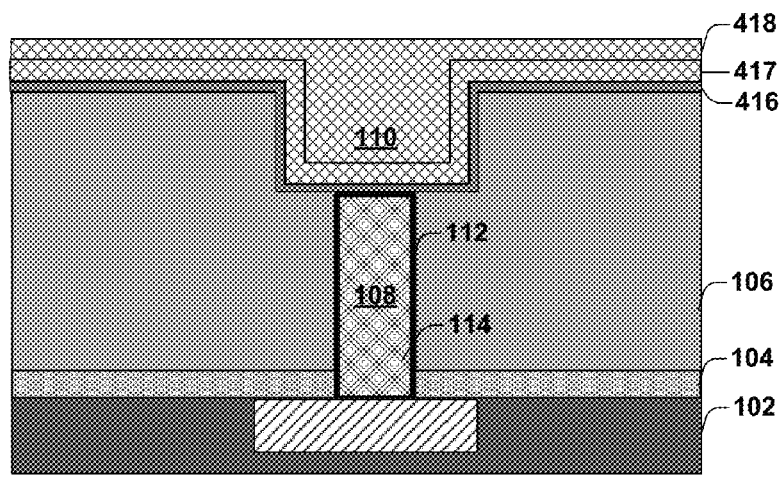

As shown in FIG. 4E, the upper portion 110 of the opening is filled with a second conductive layer 418. In some embodiments, the second conductive layer 418 is copper. A seed layer 417 comprising a same or different material as the second conductive layer 418 can be formed within the upper portion 110 prior to the formation of the second conductive layer 418. The seed layer 417 can be formed by physical vapor deposition (PVD). A planarization process, for example, a chemical-mechanical polishing (CMP) process is applied after deposition to remove an excess portion of the second conductive layer.

Figure 5:
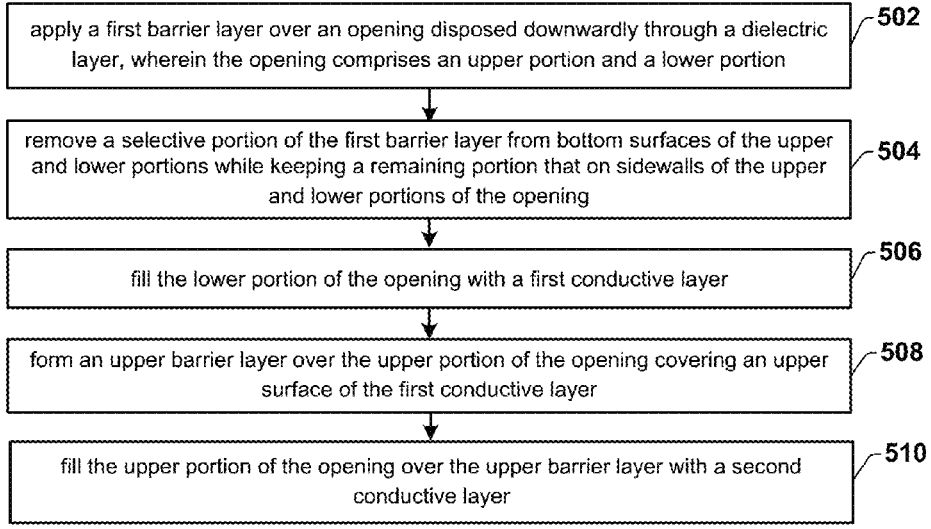
FIG. 5 shows a flow diagram of a method of filling a gap for interconnections in accordance with some other embodiments.

FIG. 5 shows a flow diagram of a method 500 of filling a gap in accordance with some other embodiments.

At 502, a first barrier layer is formed over an opening that extends downwardly through a dielectric layer, wherein the opening comprises an upper portion and a lower portion.

At 504, a selective portion of the first barrier layer is removed from bottom surfaces of the upper and lower portions while keeping a remaining portion that on sidewalls of the upper and lower portions of the opening.

At 506, the lower portion of the opening is filled with a first conductive layer.

At 508, an upper barrier layer is formed over the upper portion of the opening covering an upper surface of the first conductive layer.

At 510, the upper portion of the opening over the upper barrier layer is filled with a second conductive layer.

FIGS. 6A-6E shows cross-sectional views of a semiconductor device showing a method of filling a gap in accordance with some embodiments. Although FIGS. 6A-6E are described in relation to method 500, it will be appreciated that the structures disclosed in FIGS. 6A-6E are not limited to such a method.

Figure 6A:
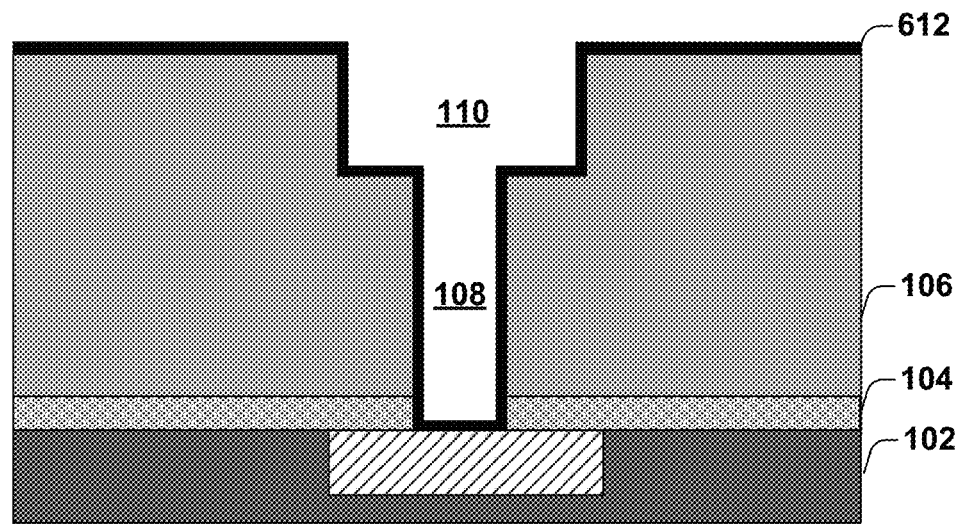
FIGS. 6A-6E show cross-sectional views of conductive interconnection layers showing a method of filling a gap for interconnections in accordance with some other embodiments.

As shown in FIG. 6A, a first barrier layer 122 is formed over an opening extending downwardly through a dielectric layer 1106, wherein the opening comprises an upper portion 110 and a lower portion 108.

Figure 6B:
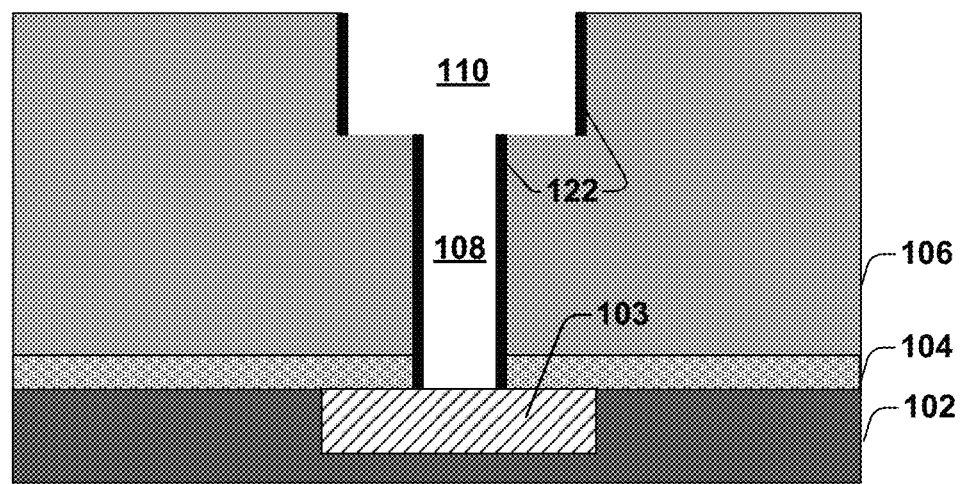

As shown in FIG. 6B, a selective portion of the first barrier layer 122 is removed from bottom surfaces of the upper and lower portions while keeping a remaining portion that on sidewalls of the upper and lower portions of the opening. An underlying conduction layer 103 is exposed. In some embodiments, the selective portion of the first barrier layer is removed by a plasma etching process. The plasma etching process uses an argon (Ar) gas or a mix of Ar and hydrogen ($H_2$) having a gas flow from approximately 100 sccm (Standard Cubic Centimeters per Minute) to approximately 1000 sccm. The plasma etching process is applied with a power between approximately 120 W (Walt) to approximately 800 W for a time of between approximately 30 s (seconds) and approximately 240 s within a processing chamber held at a temperature in a range of between approximately 25° C. and approximately 300° C. and at a pressure having a range of between approximately 1 torr and approximately 10 torr.

Figure 6C:
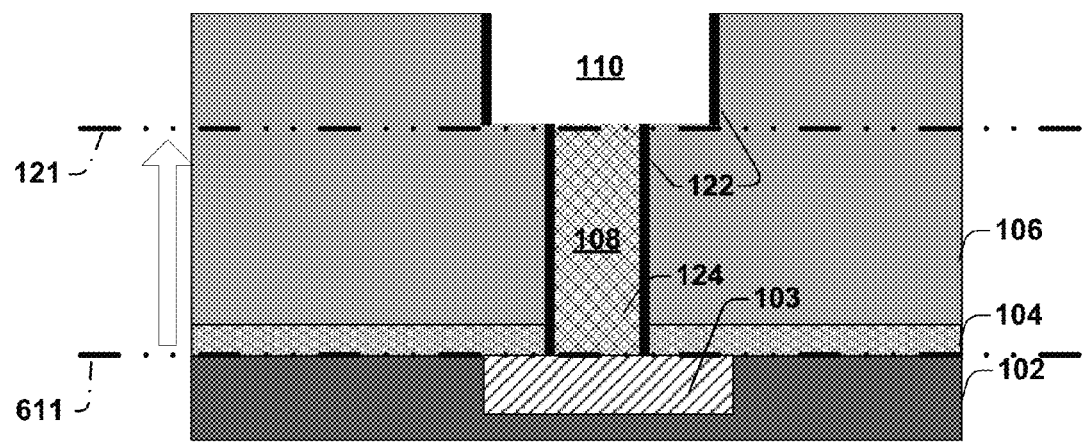

As shown in FIG. 6C, the lower portion 108 of the opening is filled with a first conductive layer 124 starting at a bottom of the lower portion of the opening along a plane 611 and progresses upwards to a surface of the lower portion of the opening along a plane 121. The first conductive layer 124 can grow directly on the underlying conduction layer 103. In some embodiments, the lower portion 108 can be filled by an electroless plating process. The electroless plating process has a bath comprising formaldehyde or glyoxyic acid as a reduction agent. The bath can further comprise a copper organic compound solvent. The first conductive layer 124 can comprise cobalt (Co), ruthenium (Ru), aluminum (Al), molybdenum (Mo), Tungsten (W), CoW, or cobalt tungsten phosphorous (CoWP). In some other embodiments, the lower portion 108 can be filled by a chemical vapor deposition (CVD) process at a temperature in a range of between approximately 100° C. and approximately 300° C. and at a pressure having a range of between approximately 1 torr and approximately 10 torr. The first conductive layer 124 can further comprise Co, Ru or Al. $H_2$ or $NH_3$ (ammonia) together with organic metal compound can be used as precursor.

Figure 6D:
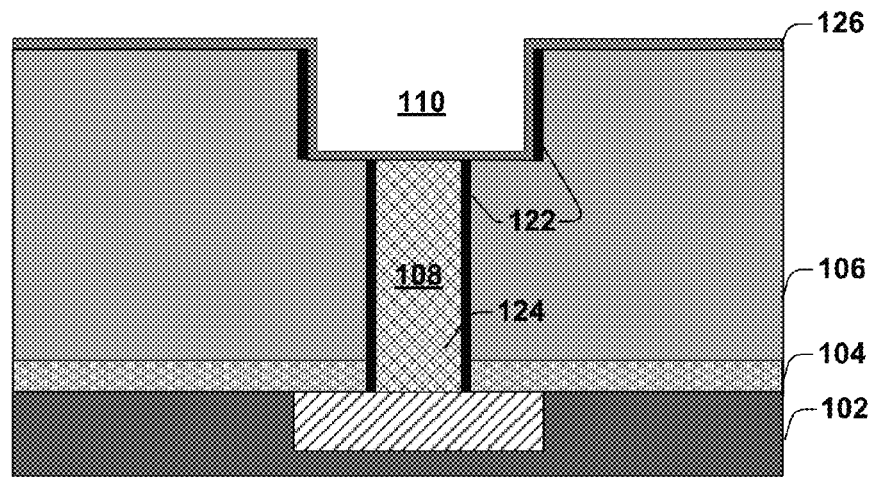

As shown in FIG. 6D, an upper barrier layer 126 is formed over the upper portion 110 of the opening covering an upper surface of the first conductive layer 124 and bottom and sidewall surfaces of the upper portion 110 of the opening.

Figure 6E:
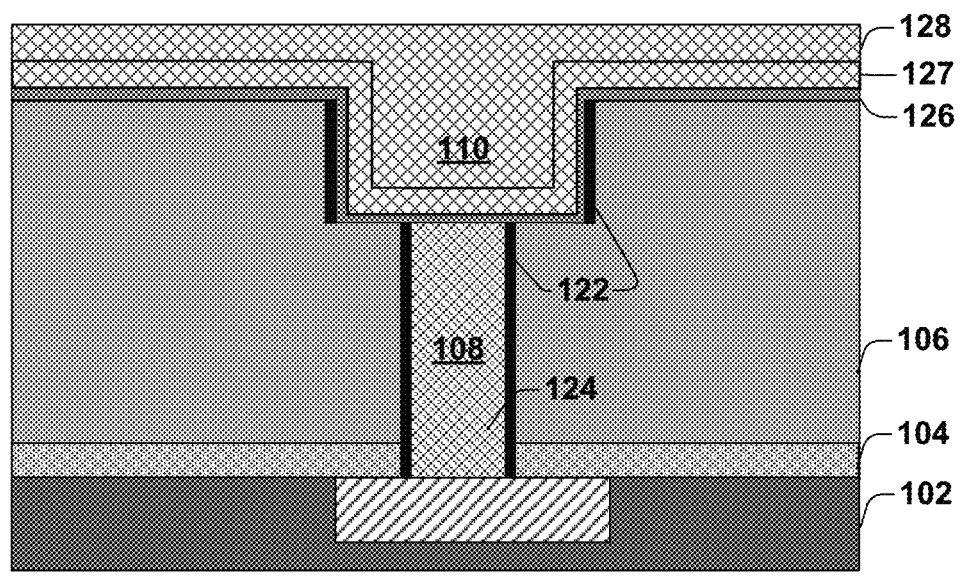

As shown in FIG. 6E, the upper portion 110 of the opening over the upper barrier layer is filled with a second conductive layer 128. A seed layer 127 comprises a same or different material with the second conductive layer 128 can be formed prior to the formation of the second conductive layer 128.

The present disclosure is related to an optimized gap filling techniques that pre-fills a lower portion of the gaps by some selective deposition methods. As a result, better conductive interconnection layers are formed.

Thus, it will be appreciated that some embodiments relate to a conductive interconnection layer. The conductive interconnection layer comprises a dielectric layer formed over a substrate. The conductive interconnection layer further comprises an opening extending downwardly through the dielectric layer comprising an upper portion above a horizontal plane and a lower portion below the horizontal plane. The conductive interconnection layer further comprises a first conductive layer filling the lower portion of the opening, an upper barrier layer disposed over the first conductive layer covering bottom and sidewall surfaces of the upper portion of the opening and a second conductive layer disposed over the upper barrier layer filling the upper portion of the opening.

Other embodiments relate to conductive interconnection layer. The conductive interconnection layer comprises one or more dielectric layers formed over a substrate.

The conductive interconnection layer further comprises a trench and an underlying via vertically extending through the dielectric layers. The via has a lateral dimension that is smaller than that of the trench. The conductive interconnection layer further comprises a first conductive layer filling a part of the via. The conductive interconnection layer further comprises an upper barrier layer disposed over the first conductive layer covering bottom and sidewall surfaces of the trench. The conductive interconnection layer further comprises a second conductive layer disposed over the upper barrier layer filling the trench.

Still other embodiments relate to a method of filling a gap for interconnections. In this method, a selective portion of a dielectric layer is removed to form an opening. The opening comprises an upper portion and a lower portion. Then the lower portion of the opening is filled with a first conductive layer. An upper barrier layer is formed over the first conductive layer covering an upper surface of the first conductive layer and bottom and sidewall surfaces of the upper portion of the opening. Then a remaining space of the upper portion of the opening is filled with a second conductive layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A conductive interconnection layer comprising:
   a dielectric layer disposed over a substrate;
   an opening extending downwardly through the dielectric layer comprising an upper portion above a horizontal plane and a lower portion below the horizontal plane;
   a first conductive layer filling the lower portion of the opening;
   an upper barrier layer disposed over the first conductive layer covering bottom and sidewall surfaces of the upper portion of the opening;
   a second conductive layer disposed over the upper barrier layer filling the upper portion of the opening; and
   a metal oxide barrier layer abutting the upper barrier layer and continuously extending around top, bottom and sidewall regions of the first conductive layer.

2. The conductive interconnection layer of claim 1, wherein the metal oxide barrier layer comprises manganese oxide.

3. The conductive interconnection layer of claim 1, wherein the metal oxide barrier layer comprises oxide compound of Manganese (Mn), Magnesium (Mg), Aluminum (Al), Zirconium (Zr), Molybdenum (Mo), Titanium (Ti), Tantalum (Ta), or Tungsten (W).

4. The conductive interconnection layer of claim 1, wherein a ratio of a largest longitudinal dimension to a smallest lateral dimension of the opening is between approximately 4:1 and approximately 10:1.

5. The conductive interconnection layer of claim 1, wherein the upper barrier layer comprises tantalum nitride (TaN), titanium nitride (TiN), manganese nitride (MnN), silicon carbon (SiC), silicon nitride (SiN), silicon oxide carbon (SiOC), or silicon oxide nitride (SiON).

6. The conductive interconnection layer of claim 1, wherein the first conductive layer comprises cobalt (Co), ruthenium (Ru), aluminum (Al), molybdenum (Mo), Tungsten (W), CoW, or cobalt tungsten phosphorous (CoWP).

7. The conductive interconnect layer of claim 1, wherein the second conductive layer is on and in direct contact with upper surfaces of the first conductive layer and the metal oxide barrier layer.

8. The conductive interconnect layer of claim 1, wherein the first conductive layer and the metal oxide barrier layer are on and in direct contact with an underlying conductive interconnection layer.

9. The conductive interconnect layer of claim 1, wherein the metal oxide barrier layer has a width that is less than a width of the second conductive layer.

10. A conductive interconnection layer comprising:
    one or more dielectric layers formed over a substrate;
    a trench and an underlying via hole vertically extending through the dielectric layers;
    a first conductive layer filling a part of the via hole;
    a lower barrier layer comprising a first portion disposed on sidewalls of via hole and a second portion discontinuous from the first portion and disposed on sidewall surfaces of the trench;
    an upper barrier layer disposed over the first conductive layer covering bottom and the sidewall surfaces of the trench, wherein the upper barrier layer abuts sidewalls of the second portion and an upper surface of the first portion; and
    a second conductive layer disposed over the upper barrier layer and filling the trench;
    wherein a lower surface of the upper barrier layer abuts the one or more dielectric layers on a lower surface of the trench at a position laterally between the first portion and the second portion of the lower barrier layer.

11. The conductive interconnection layer of claim 10, further comprising a seed layer disposed between the upper barrier layer and the second conductive layer.

12. The conductive interconnection layer of claim 10, wherein the first conductive layer is abutting an underneath conductive interconnection layer.

13. The conductive interconnect layer of claim 10, wherein the second conductive layer is on and in direct contact with upper surfaces of the first conductive layer and the lower barrier layer.

14. The conductive interconnection layer of claim 10, wherein the lower barrier layer comprises tantalum nitride (TaN), titanium nitride (TiN), manganese nitride (MnN), silicon carbon (SiC), silicon nitride (SiN), silicon oxide carbon (SiOC), or silicon oxide nitride (SiON).

15. The conductive interconnect layer of claim 10, wherein the trench has straight sidewalls and extends laterally beyond the via in one or more directions.

16. A method of filling a gap for interconnections, the method comprising:
  removing a selected portion of a dielectric layer to form an opening comprising an upper portion and a lower portion;
  applying a first barrier layer over the opening prior to filling a first conductive layer;
  removing a selective portion of the first barrier layer from bottom surfaces of the upper and lower portions of the opening while keeping a remaining portion that on sidewalls of the upper and lower portions of the opening prior to filling the first conductive layer;
  filling the lower portion of the opening with the first conductive layer;
  applying an upper barrier layer over the first conductive layer covering bottom and sidewall surfaces of the upper portion of the opening; and
  filling a remaining space of the upper portion of the opening with a second conductive layer.

17. The method according to claim 16, wherein the lower portion of the opening is filled by a bottom up plating process or a chemical vapor deposition process.

18. The method according to claim 16, wherein the opening is formed by dual damascene process.

19. The method of claim 16, wherein the first conductive layer is formed by:
  filling the lower portion of the opening with an alloy layer comprising a first metal element and a second metal element;
  annealing to form a metal oxide barrier layer at an interface of the alloy layer and the dielectric layer, wherein the metal oxide barrier layer comprising the second metal element migrating from the alloy layer;
  applying an upper barrier layer over the metal oxide barrier layer covering bottom and sidewall surfaces of the upper portion of the opening; and
  filling a remaining space of the upper portion of the opening with a second conductive layer.

20. The method according to claim 19, wherein the first metal element of the alloy layer is copper and the second metal element of the alloy layer is Manganese (Mn), Magnesium (Mg), Aluminum (Al), Zirconium (Zr), Molybdenum (Mo), Titanium (Ti), Tantalum (Ta), or Tungsten (W).

* * * * *